(12) United States Patent
Miyashita et al.

(10) Patent No.: US 8,158,238 B2
(45) Date of Patent: **\*Apr. 17, 2012**

(54) ELECTROSTATIC CHUCK AND ELECTRODE SHEET FOR ELECTROSTATIC CHUCK

(75) Inventors: Kinya Miyashita, Kawasaki (JP); Hiroshi Fujisawa, Nara (JP); Riichiro Harano, Kawasaki (JP)

(73) Assignee: Creative Technology Corporation, Tokyo (JP)

( * ) Notice: Subject to any disclaimer, the term of this patent is extended or adjusted under 35 U.S.C. 154(b) by 1153 days.

This patent is subject to a terminal disclaimer.

(21) Appl. No.: 11/922,458

(22) PCT Filed: Jul. 7, 2006

(86) PCT No.: PCT/JP2006/313586
§ 371 (c)(1),
(2), (4) Date: Dec. 19, 2007

(87) PCT Pub. No.: WO2007/007674
PCT Pub. Date: Jan. 18, 2007

(65) Prior Publication Data
US 2009/0041980 A1    Feb. 12, 2009

(30) Foreign Application Priority Data

Jul. 8, 2005 (JP) ................................. 2005-200739
Dec. 12, 2005 (JP) ................................. 2005-357641

(51) Int. Cl.
*B32B 3/24* (2006.01)
*H01L 21/68* (2006.01)

(52) U.S. Cl. ........................................ 428/138; 361/234

(58) Field of Classification Search ................... 428/138; 361/234
See application file for complete search history.

(56) References Cited

U.S. PATENT DOCUMENTS

| | | | |
|---|---|---|---|
| 7,881,036 B2 * | 2/2011 | Fujisawa et al. | 361/234 |
| 2002/0004134 A1 | 1/2002 | Shima et al. | |
| 2004/0179323 A1 * | 9/2004 | Litman et al. | 361/234 |
| 2007/0223173 A1 | 9/2007 | Fujisawa et al. | |
| 2010/0149720 A1 | 6/2010 | Fujisawa et al. | |

FOREIGN PATENT DOCUMENTS

JP         10-223742 A      8/1998
(Continued)

OTHER PUBLICATIONS

Extended European Search Report issed an Oct. 13, 2010 in corresponding European Patent Application No. 06 76 7996.

*Primary Examiner* — William P Watkins, III
(74) *Attorney, Agent, or Firm* — Birch, Stewart, Kolasch & Birch, LLP

(57) ABSTRACT

An electrostatic chuck having excellent chucking force and holding force is provided. The electrostatic chuck includes a laminate structure in which a first insulating layer, a first electrode layer, an interelectrode insulating layer, a second electrode layer and a second insulating layer are successively laminated on a metal base in an order of increasing distance from the metal base. The second electrode layer includes a pattern electrode having a plurality of opening portions within a flat area, and a shortest distance X between mutually opening portions and a length L of a line segment formed by feet of perpendiculars when barycenters of the adjacent opening portions are projected to a virtual line which is a straight line parallel to the shortest distance X satisfy $L/X \geq 1.5$ and $L < 2.6$ mm.

11 Claims, 14 Drawing Sheets

FOREIGN PATENT DOCUMENTS

| | | |
|---|---|---|
| JP | 2000-502509 A | 2/2000 |
| JP | 2002-83862 A | 3/2002 |
| JP | 2003-77995 A | 3/2003 |
| JP | 2003-243493 A | 8/2003 |
| JP | 2004-22888 A | 1/2004 |
| JP | 2004-152950 A | 5/2004 |
| JP | 2005-64105 A | 3/2005 |
| WO | WO 2005/091356 A1 | 9/2005 |

* cited by examiner

ELECTROSTATIC CHUCK AND ELECTRODE SHEET FOR ELECTROSTATIC CHUCK

TECHNICAL FIELD

The present invention relates to an electrostatic chuck and an electrode sheet for the electrostatic chuck.

BACKGROUND ART

Electrostatic chucks are widely used in order to attract/hold a wafer made of a semiconductor such as silicon in various devices including an ion implanting device, a plasma processing device, an etching device, an electron exposure device, and an ion rendering device during a semiconductor producing process. Also, in a liquid crystal producing field, the electrostatic chucks are used in order to attract/hold a glass substrate serving as an insulating substrate in a substrate bonding device employed to press-insert a liquid crystal between the insulating substrates, an ion doping apparatus, or the like.

In recent years, a panel size is becoming increasingly larger as the demand for flat panel displays grows. For example, a liquid crystal mother glass substrate having a size as large as 2 m×2 m has appeared. In order to process such a large substrate, it is important to further improve a holding force and a chucking force which can be exercised by the electrostatic chuck.

In contrast to this, the further improvement in processing performance of the ion implanting device or the like is required in the semiconductor producing process. For example, in order to improve the processing performance of the ion implanting device, it is necessary to increase an ion beam current. However, an increase in an ion beam current has let to a problem in which the amount of ions implanted to a silicon wafer per unit time increases and the cooling performance of the electrostatic chuck for cooling the silicon wafer cannot sufficiently accommodate the increase. That is, the substrate attracted by the electrostatic chuck is normally cooled through a sample chucking surface of the electrostatic chuck by a cooling means included in the electrostatic chuck. However, a substrate temperature of the silicon wafer or the like tends to increase with an increase in amount of ions implanted and there are causes such as inherent warp or distortion of the substrate and the poor flatness of the sample chucking surface, so there is a problem that the substrate cannot be brought into sufficient contact with the sample chucking surface and thus the substrate is not cooled as much. For example, when it is necessary to process the substrate in a predetermined pattern as in the case of ion implantation, a resist film is provided on the surface of the substrate. However, when the substrate is not sufficiently cooled, the temperature thereof exceeds a heat resistance temperature of the resist film. Therefore, the resist film is hardened, so it is difficult to remove the resist film from the substrate. Thus, subsequent processes may be affected.

With an increase in size of a silicon wafer or a substrate made of glass or the like, a problem with respect to the cooling of the substrate becomes more significant. When the substrate to be attracted becomes larger, it is important to be able to sufficiently ensure the flatness of the substrate attracted to the sample chucking surface. Also in this respect, it is essential to improve the chucking force of the electrostatic chuck.

In a bipolar electrostatic chuck for applying positive and negative voltages to two electrodes, a gradient force F produced in the case of an uneven electric field as expressed by the following formula (1) may be one of factors for the attracting of the substrate. The gradient force F is proportional to the spatial differential of an electric field intensity E squared, that is, the gradient.

$$F \propto \nabla(E^2) \tag{1}$$

Up to now, in order to increase the electric field intensity E, several electrostatic chucks have been reported in which two pattern electrodes each having a comb-shaped conductive portion are alternately arranged within the same plane to further narrow a distance between adjacent electrodes (for example, see JP Patent Documents 1 and 2). However, when the distance between the adjacent electrodes is further narrowed, it is likely to cause a discharge between the electrodes. In general, when the distance between the electrodes is 0.5 mm, a discharge limit is approximately 3 kV. However, when the electrostatic chuck in which the comb-shaped pattern electrodes are alternately arranged is actually used, a voltage lower than the discharge limit must be applied in view of a safety rate. Therefore, it is difficult to apply a sufficient chucking force to particularly a large substrate.

Under the circumstances, in the previous application, the inventors of the present invention proposed a bipolar electrostatic chuck having a laminate structure in which a first insulating layer, a first electrode layer, an interelectrode insulating layer, a second electrode layer, and a second insulating layer are successively laminated on a metal base in the order of increasing distance from the metal base (PCT/JP2005/004557). The interelectrode insulating layer is provided between the first electrode layer and the second electrode layer, so the electrostatic chuck has excellent reliability with respect to a dielectric breakdown strength and can exercise a high gradient force sufficiently adaptable to a large sample. In addition to this, a bipolar electrostatic chuck is reported in which a second electrode layer and a first electrode layer are arranged in a thickness direction of the electrostatic chuck such that an insulating layer is located between the two electrode layers (see Patent Documents 3 and 4). However, up to now, such a type of electrostatic chuck is not sufficiently studied in view of the effective exercise of the gradient force.

Patent Document 1: JP 10-223742 A
Patent Document 2: JP 2000-502509 A
Patent Document 3: JP 2005-64105 A
Patent Document 4: JP 2003-243493 A

DISCLOSURE OF THE INVENTION

Problems to be Solved by the Invention

Therefore, in order to be sufficiently adaptable to a held substrate which is increased in size and to solve the problems with respect to the cooling of the substrate, the inventors of the present invention intensively studied a bipolar electrostatic chuck having a laminate structure in which a first electrode layer and a second electrode layer are laminated through an interelectrode insulating layer in view of the further improvement in a chucking force and a holding force of the electrostatic chuck. As a result, it is found that, when shapes of electrodes forming the electrode layers are optimized, in particular, a shape of an electrode forming the second electrode layer located on a sample chucking surface side holding the substrate is optimized, and when the second electrode layer is formed from a pattern electrode located such that a plurality of opening portions satisfy a predetermined relational formula, a gradient force can be effectively exercised and the electrostatic chuck which exercises an excellent chucking force can be obtained. Accordingly, the present invention has been accomplished.

Accordingly, an object of the present invention is to provide an electrostatic chuck which exercises an excellent chucking force and an excellent holding force. Another object of the present invention is to provide an electrode sheet for the electrostatic chuck which exercises the excellent chucking force and the excellent holding force.

Means for Solving the Problems

Accordingly, the present invention relates to an electrostatic chuck including a laminate structure in which a first insulating layer, a first electrode layer, an interelectrode insulating layer, a second electrode layer, and a second insulating layer are successively laminated on a metal base in an order of increasing distance from the metal base, in which: the second electrode layer includes a pattern electrode having a plurality of opening portions within a flat area; and a shortest distance X between mutually adjacent opening portions and a length L of a line segment formed by feet of perpendiculars when barycenters of the adjacent opening portions are projected to a virtual line which is a straight line parallel to the shortest distance X satisfy $L/X \geqq 1.5$ and $L<2.6$ mm.

The present invention also relates to an electrode sheet for an electrostatic chuck including a laminate structure in which a first insulating layer, a first electrode layer, an interelectrode insulating layer, a second electrode layer, and a second insulating layer are successively laminated, in which: the second electrode layer includes a pattern electrode having a plurality of opening portions within a flat area; and a shortest distance X between mutually adjacent opening portions and a length L of a line segment formed by feet of perpendiculars when barycenters of the adjacent opening portions are projected to a virtual line which is a straight line parallel to the shortest distance X satisfy $L/X \geqq 1.5$ and $L<2.6$ mm.

In the present invention, the second electrode layer includes the pattern electrode having the plurality of opening portions within the flat area. Shape of the opening portions can include, for example, a circle, an ellipse, a polygon or regular polygon, such as a triangle, and a rectangle. The second electrode layer may include a pattern electrode formed to have a mesh-shaped conductive portion in which a plurality of opening portions each having one or plural kinds of shapes selected from the above shapes are arranged. Alternatively, the second electrode layer may include a pattern electrode formed to have a comb-shaped conductive portion in which a plurality of rectangular opening portions, which are opened at one end, are arranged.

With respect to the pattern electrode forming the second electrode layer, the shortest distance X between the adjacent opening portions of the plurality of opening portions and the length L of the line segment formed by the feet of the perpendiculars when barycenters of the adjacent opening portions are projected to the virtual line which is the straight line parallel to the shortest distance X are set so as to satisfy $L/X \geqq 1.5$, preferably $L/X \geqq 2$ and $L<2.6$ mm, preferably $L \leqq 2.2$ mm, more preferably $L \leqq 2.0$ mm, further preferably $0.3$ mm $\leqq L \leqq 1.3$ mm. Here, L/X is an index indicating a ratio of the opening formed by the opening portions to the shortest distance X between the two adjacent opening portions. The degree of opening increases as the value L/X becomes larger. When the degree of opening increases, the distribution of a potential which penetrates (penetration potential) from the first electrode layer located on a side (metal base side) lower than the second electrode layer can be increased, so a gradient force is more easily generated. When L/X is smaller than 1.5, the penetration potential from the first electrode layer is insufficient, so a sufficient chucking force and a sufficient holding force cannot be exercised to a silicon wafer or a substrate made of glass or the like. On the other hand, the gradient force may be concentrated in a portion extending to both the opening portion side and the conductive portion side relative to an end of the opening portion (edge of the opening portion), that is, a boundary between the opening portion and the conductive portion. Therefore, when there is an opening having a certain size in view of a relationship between the two adjacent opening portions, that is, when L/X becomes larger than 5, an effect for generating the gradient force may be saturated. When the length L of the line segment formed when the barycenters of the adjacent opening portions are projected to the virtual line becomes equal to or larger than 2.6 mm, a total gradient force acting the substrate reduces, so it is difficult to exercise the sufficient chucking force and the holding force.

When the second electrode layer in the present invention is the pattern electrode satisfying relation expressions with respect to L/X and L, the shortest distance X between the adjacent opening portions may be equal to or larger than 0.2 mm, preferably equal to or larger than 0.3 mm. When the shortest distance X is equal to or larger than 0.2 mm, the gradient force can be efficiently generated to exercise the sufficient chucking force and the holding force.

Here, a method of obtaining the shortest distance X between the adjacent opening portions and the length L of the line segment will be described with reference to an example of the pattern electrode. FIG. 1 is an enlarged (part) view showing the pattern electrode formed to have a mesh-shaped conductive portion 5b in which a plurality of opening portions, each of which has a circular shape, are arranged, that is, a plurality of circular holes 5c are arranged within a flat area. For example, when attention is focused on a circular hole "A" in FIG. 1, the shortest distance X between mutually adjacent opening portions (circular holes 5c) of the plurality of opening portions (circular holes 5c) is assumed to be a shortest distance between the circular hole "A" and a circular hole B which is one of adjacent circular holes closest to the circular hole "A". In FIG. 1, the adjacent circular holes closest to the circular hole "A" are a circular hole C, a circular hole D, a circular hole E, a circular hole F, and a circular hole G which are located at the shortest distance X from the circular hole "A", in addition the circular hole B. However, the adjacent circular hole H is not located closest to the circular hole "A", so the circular hole H is eliminated from consideration.

The length L of the line segment formed by the feet of the perpendiculars when the barycenters of the adjacent opening portions are projected to the virtual line which is the straight line parallel to the shortest distance X is the length L of the segment formed by intersections between each of perpendiculars and a virtual line "l" when the barycenter of the circular hole "A" and the barycenter of the circular hole B are projected to the virtual line "l" which is a straight line parallel to the shortest distance X between the circular hole "A" and the circular hole B in, for example, FIG. 1.

FIG. 2 is an enlarged (part) view showing the pattern electrode formed to have a comb-shaped conductive portion 5b in which a plurality of rectangular opening portions 5a, each of which are opened at one end, are arranged. In the present invention, as shown in FIG. 2, the plurality of rectangular opening portions, which are opened at one end, may be arranged to form the pattern electrode. Even in this case, the shortest distance X between the adjacent opening portions 5a is determined first. The straight line 1 parallel to the shortest distance X is assumed to be the virtual line and the barycenters of the adjacent opening portions 5a are projected to the virtual line "l". Therefore, the length L of the line segment formed by the intersections between each of the perpendiculars at the time of projection and the virtual line "l" is desirably obtained.

Even when the shapes of the opening portions, the arrangements thereof, and the like are different from those shown in FIG. 1 or 2, the shortest distance X and the length L of the line segment are desirably obtained based on the methods described in FIGS. 1 and 2. The shapes of the opening portions for forming the pattern electrode and the arrangement method thereof are not particularly limited. However, for example, in the case of the pattern electrode formed to have the mesh-shaped conductive portion in which the plurality of opening portions are arranged, as shown in FIG. 1, the opening portions are preferably arranged such that the barycenters of at least the adjacent opening portions are located on a straight line including a line corresponding to the shortest distance X between the adjacent opening portions. The opening portions are more preferably arranged at predetermined regular intervals such that the barycenters of opening portions other than the adjacent opening portions and not directly adjacent to each other are located on the straight line including the line corresponding to the shortest distance X. All opening portions within the flat area of the pattern electrode are further preferably arranged at predetermined regular intervals. In the case of the pattern electrode formed to have the comb-shaped conductive portion in which the plurality of rectangular opening portions, which are opened at one end, are arranged, as shown in FIG. 2, the shapes of the opening portions are preferably made equal to one another are such that the barycenters of the opening portions other than the adjacent opening portions are located on the straight line including the line corresponding to the shortest distance X between the adjacent opening portions. Even when the pattern electrode includes a hole, an opening, or the like which do not substantially act as the opening portion in view of size in the present invention, the shortest distance X and the length L of the line segment are obtained based on a subject which substantially act as the opening portion.

With respect to the first electrode layer in the present invention, at least a part of the first electrode layer is preferably located corresponding to the opening portions such that the potential can penetrate through the opening portions of the pattern electrode forming the second insulating layer. The first electrode layer is preferably located in all portions corresponding to the opening portions. The first electrode layer may be formed from the pattern electrode having the mesh-shaped or comb-shaped conductive portion as in the case of the second electrode layer. However, when the ease of producing and the like are taken into account, the entire flat area is preferably the conductive portion.

A material of each of the first electrode layer and the second electrode layer may include copper, tungsten, aluminum, nickel, chromium, silver, platinum, tin, molybdenum, magnesium, palladium, or tantalum. Copper or aluminum is preferably used in view of conductivity or productivity. The materials of the first electrode layer and the second electrode layer may be the same or different from each other. A film thickness of each of the first electrode layer and the second electrode layer can be selected as appropriate and is preferably 0.1 μm to 20 μm. In particular, the film thickness of the second electrode layer is further preferably 0.1 μm to 5 μm. In the case of the second electrode layer, it is likely that the unevenness of the pattern electrode is reflected on the surface of the second insulating layer forming the sample chucking surface. However, in a range of 0.1 μm to 5 μm, the flatness of the sample chucking surface can be maintained to Ra of approximately 1 μm without the need of special processing such as lapping.

Each of the first electrode layer and the second electrode layer may be formed to have a predetermined-shaped conductive portion using a foil made of any one of the metals described above or formed to have a predetermined conductive portion by etching or the like using a laminate in which the metal foil is laminated on each of front and rear surfaces of an insulating film. The metal film may be formed on the surface of any one of the first insulating layer, the interelectrode insulating layer, or the second insulating layer by a sputtering method, an ion plating method (ion plating evaporation method), a vapor phase growth method, plating processing, or the like and then etched in a predetermined shape if necessary to form the conductive portion. Alternatively, a metal paste may be printed on a predetermined surface to form the conductive portion. Further, a high-melting point metal such as molybdenum, tungsten, or tantalum may be thermally sprayed onto a predetermined surface to form the conductive portion. In particular, when the thin second electrode layer whose film thickness is 0.1 μm to 5 μm is to be formed, the ion plating method is suitably used.

Each of the first insulating layer, the interelectrode insulating layer, and the second insulating layer may be a resin layer made of one or plural kinds of resins selected from, for example, polyimide, polyamide, polyester, polyethylene terephthalate, epoxy, and acrylic, a ceramic layer made of one or plural kinds of materials selected from aluminum oxide, aluminum nitride, silicon carbide, silicon nitride, zirconia, and titania, or a layer made of one or two kinds of materials selected from silicon and silicon dioxide. Of these, a resin layer made of one or plural kinds of resins selected from polyimide, polyamide, polyester, polyethylene terephthalate, and epoxy may be preferably used in view of mass productivity. In view of insulation resistance and chemical resistance, polyimide is further preferably used. The first insulating layer, the interelectrode insulating layer, and the second insulating layer may be made of the same material or different materials selected as appropriate. The respective film thicknesses can be selected as appropriate. However, it is preferable to set the thickness of the first insulating layer to 25 μm to 100 μm, set the thickness of the interelectrode layer to 25 μm to 100 μm, and set the thickness of the second insulating layer to 50 μm to 300 μm.

For example, an aluminum base made of an aluminum alloy which is normally used can be employed as the metal base. In the present invention, a flexible layer which has a film thickness of 500 μm to 1000 μm and is made of a silicone rubber may be provided between the metal base and the first insulating layer. In general, in the case where the second insulating layer forming the sample chucking surface is made of an elastic material such as a rubber, when a substrate such as a silicon wafer is attracted by the electrostatic chuck, a contact ratio (degree of contact) between the sample chucking surface and the substrate is at most on the order of several % to 10%. When the second insulating layer is made of polyimide, the contact ratio may be reduced to approximately 1%. Therefore, when the flexible layer is provided between the metal base and the first insulating layer as described above, the contact ratio between the sample chucking surface and the substrate can be improved. For example, when the second insulating layer is made of polyimide, a lower limit of the contact ratio can be increased to approximately 2%.

A method of producing the electrostatic chuck according to the present invention is not particularly limited. However, for example, the electrostatic chuck having the laminate structure may be formed by successively laminating the first insulating layer, the first electrode layer, the interelectrode insulating layer, the second electrode layer, and the second insulating layer on the metal base in the order of increasing distance from the metal base, then sandwiching the flexible layer between the metal base and the first insulating layer if necessary, and performing thermo compression bonding under predetermined heating and pressurization conditions. Alternatively, the electrostatic chuck having the laminate structure may be formed by forming, in advance, the electrode sheet in which the first insulating layer, the first electrode layer, the interelectrode insulating layer, the second electrode layer, and the second insulating layer are successively laminated, then sandwiching the flexible layer between the electrode sheet and the metal base if necessary, and performing thermo compression bonding under predetermined heating and pressurization conditions. Note that, as described above, the first electrode layer and the second electrode layer may be integrally formed in advance with any one of the first insulating layer, the interelectrode insulating layer, and the second insulating layer and the thermo compression bonding may be performed to form the electrostatic chuck as described above. The shape of the electrostatic chuck in the present invention, the size thereof, and the like are not particularly limited. That is, for example, a flat shape of the sample chucking surface can be designed to have a circular shape or a rectangular shape as appropriate corresponding to the shape of the substrate which is an object to be attracted, the size thereof, and the like.

Effects of the Invention

According to the present invention, the shape of the pattern electrode forming the second electrode layer is specified, so the penetration potential from the first electrode layer, which is distributed on the sample chucking surface side can be optimized. Therefore, it is possible to obtain the electrostatic chuck which efficiently generates the gradient force on the sample chucking surface to exercise the excellent chucking force and the excellent holding force. In the electrostatic chuck according to the present invention, the second electrode layer located on the sample chucking surface side includes the pattern electrode having the predetermined opening portions, so a Coulomb force acts in addition to the gradient force. Therefore, the excellent chucking force and the excellent holding force can be exercised to any one of a semiconductor substrate such as a silicon wafer and an insulating substrate such as a glass substrate. Such an electrostatic chuck is sufficiently adaptable to the requirement for an increase in size of the held substrate. Further, the contact characteristic of the substrate to the sample chucking surface can be improved, so the substrate can be efficiently cooled.

BRIEF DESCRIPTION OF THE DRAWINGS

FIG. 12(1) shows the case where Z=1 mm, a width d of each of the opening portions 5a is 0.75, and L/X is 2.5 and FIG. 12(2) shows the case where Z=1 mm, the width d of each of the opening portions 5a is 0.25, and L/X is 1.2.

FIG. 14(1) shows the case where Z=1.5 mm, a diameter d of each of circular holes 5c is 0.75 mm, and L/X is 1.5 and FIG. 14(2) shows the case where Z=1.5 mm, the diameter d of each of the circular holes 5c is 0.25 mm, and L/X is 1.1.

Figure 1:
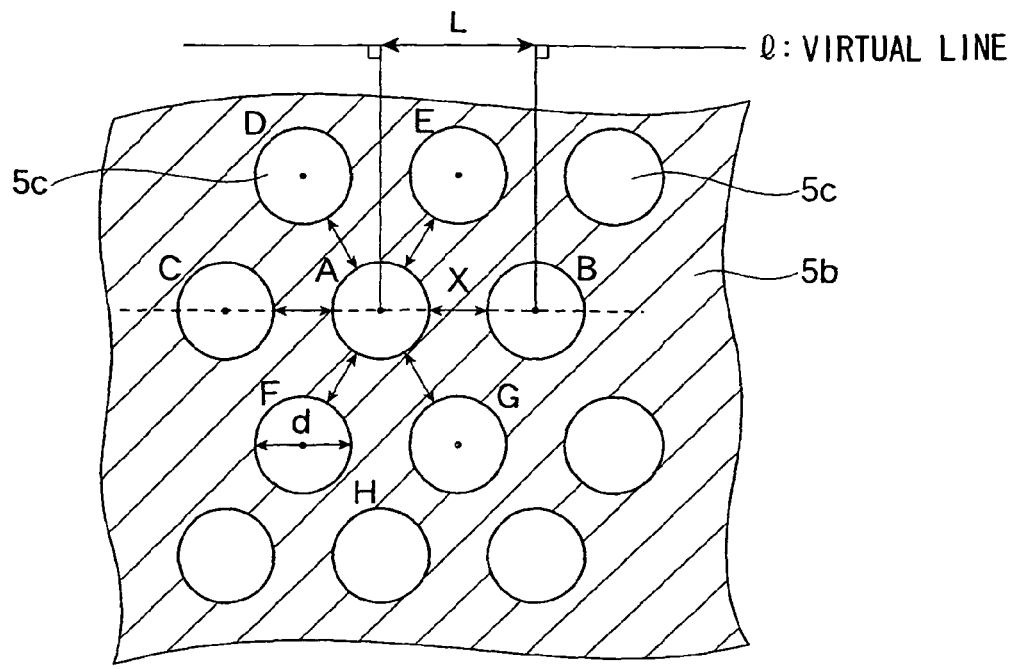
FIG. 1 is a partially enlarged view showing a pattern electrode (second electrode layer) formed to have a mesh-shaped conductive portion in which a plurality of circular holes are arranged within a flat area.

DESCRIPTION OF REFERENCE NUMERALS x: bipolar electrostatic chuck, 1: metal base, 2: first insulating layer, 3: first electrode layer, 4: interelectrode insulating layer, 5: second electrode layer (pattern electrode), 5a: opening portion, 5b: conductive portion, 5c: circular holes, 6: second insulating layer, 7: sample chucking surface, 8: substrate, 9: electrode sheet.

BEST MODE FOR CARRYING OUT THE INVENTION

Hereinafter, preferred embodiment modes of the present invention will be specifically described with reference to calculation examples and embodiments.

First Calculation Example

Figure 2:
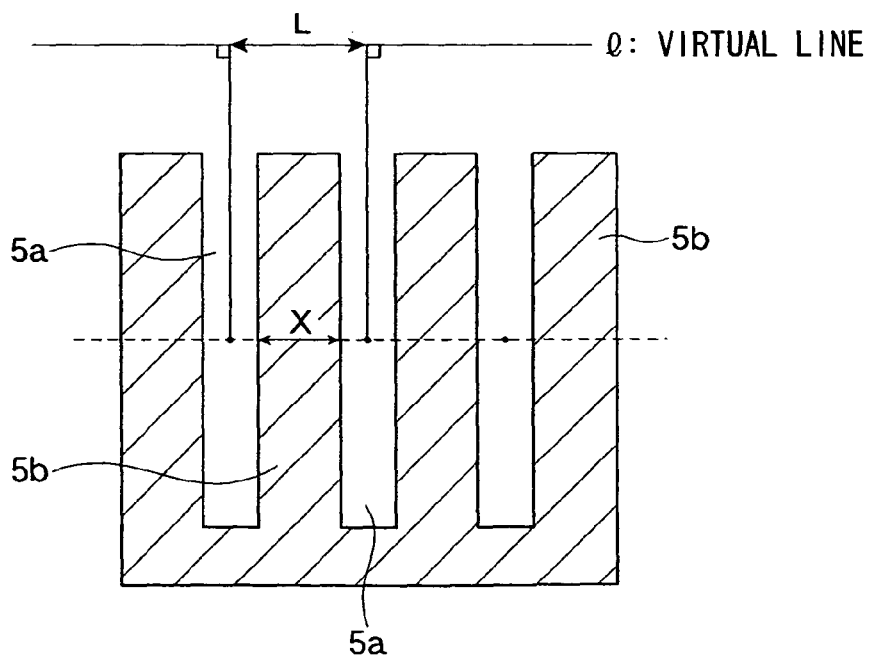
FIG. 2 is a partially enlarged view showing a pattern electrode (second electrode layer) formed to have a comb-shaped conductive portion in which a plurality of rectangular opening portions, which are opened at one end, are arranged within a flat area.
Figure 3:
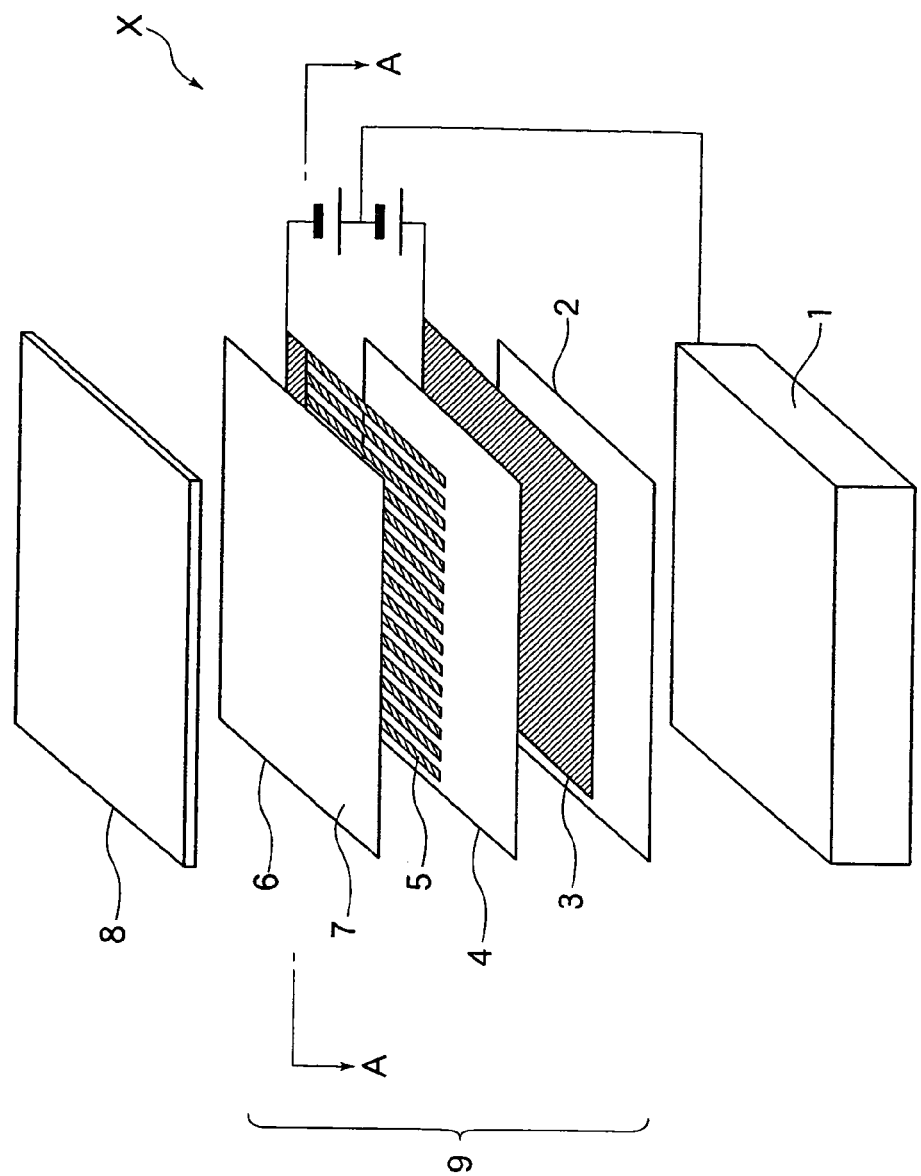
FIG. 3 is an explanatory exploded perspective view showing an electrostatic chuck according to the present invention.
Figure 4:
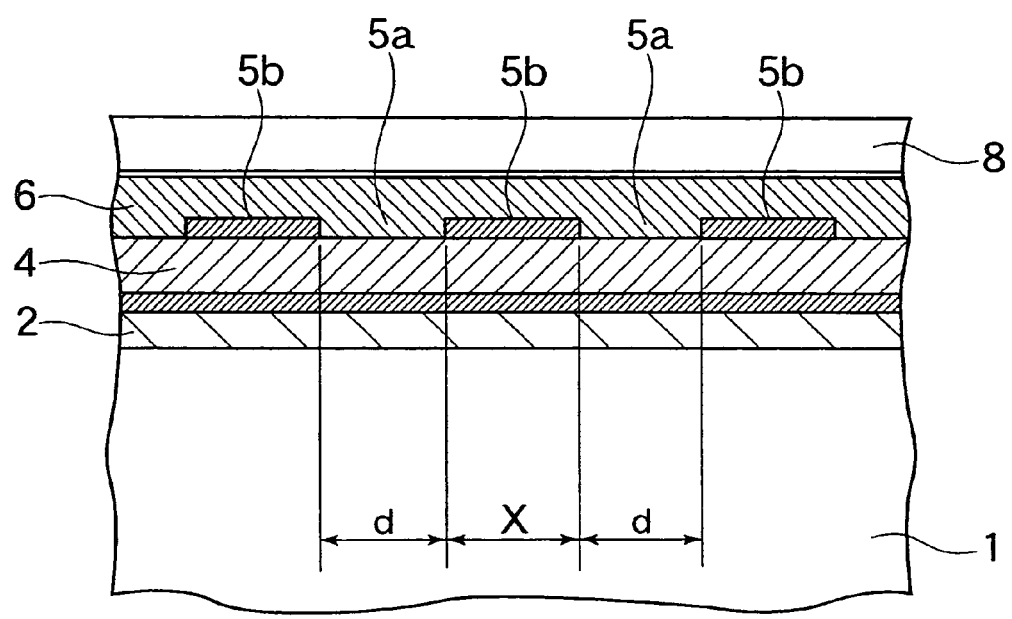
FIG. 4 is an explanatory view showing (a part of) a cross-section A-A' of the electrostatic chuck shown in FIG. 3.

As shown in FIG. 2, a second electrode layer is a pattern electrode in which a plurality of rectangular opening portions, which are opened at one end, are arranged to form a comb-shaped conductive portion and the barycenters of opening portions other than adjacent opening portions are located on a straight line including a line corresponding to a shortest distance X between the adjacent opening portions. In this case, a relationship between the shortest distance X between the adjacent opening portions and a chucking force in the case where the pattern electrode is used for the electrostatic chuck is examined. As shown in FIGS. 3 and 4, an electrostatic chuck X has a laminate structure in which a first insulating layer 2, a first electrode layer 3, an interelectrode insulating layer 4, a second electrode layer 5, and a second insulating layer 6 are successively laminated on a metal base 1 in the order of increasing distance from the metal base 1. While the shortest distance X between mutually adjacent opening portions 5a of the pattern electrode forming the second insulating layer 5 is made equal to a width d of each of the opening portions 5a, that is, while X=d is maintained, the values of X and d are adjusted and the chucking force per unit area on a sample chucking surface 7 corresponding to a surface of the second insulating layer 6 is obtained by calculation.

Figure 5:
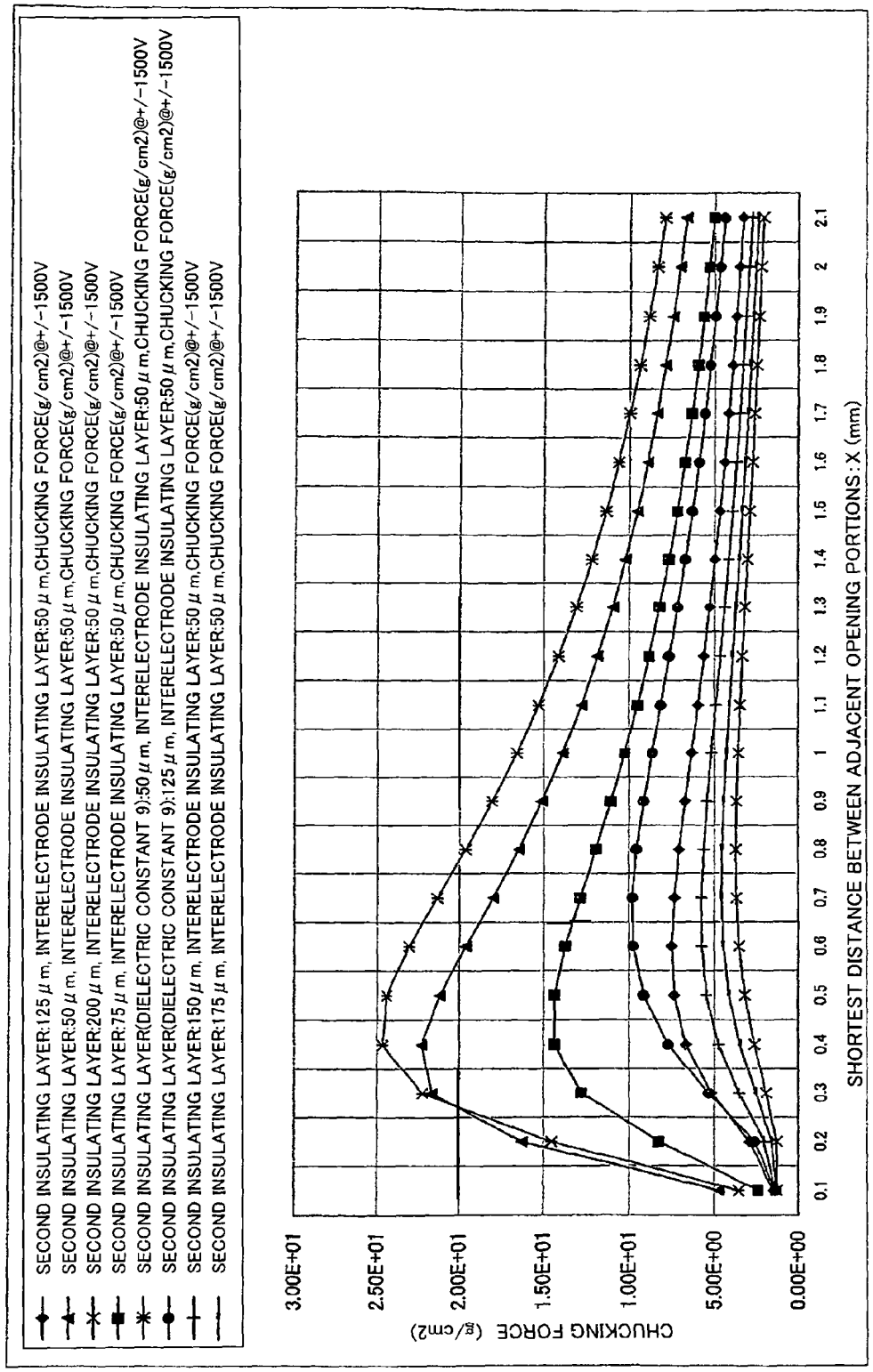
FIG. 5 is a graph showing a relationship between a shortest distance X between adjacent opening portions in the pattern electrode having the comb-shaped conductive portion and a chucking force in the case where the pattern electrode is used for the electrostatic chuck (film thickness of interelectrode insulating layer is fixed).
Figure 6:
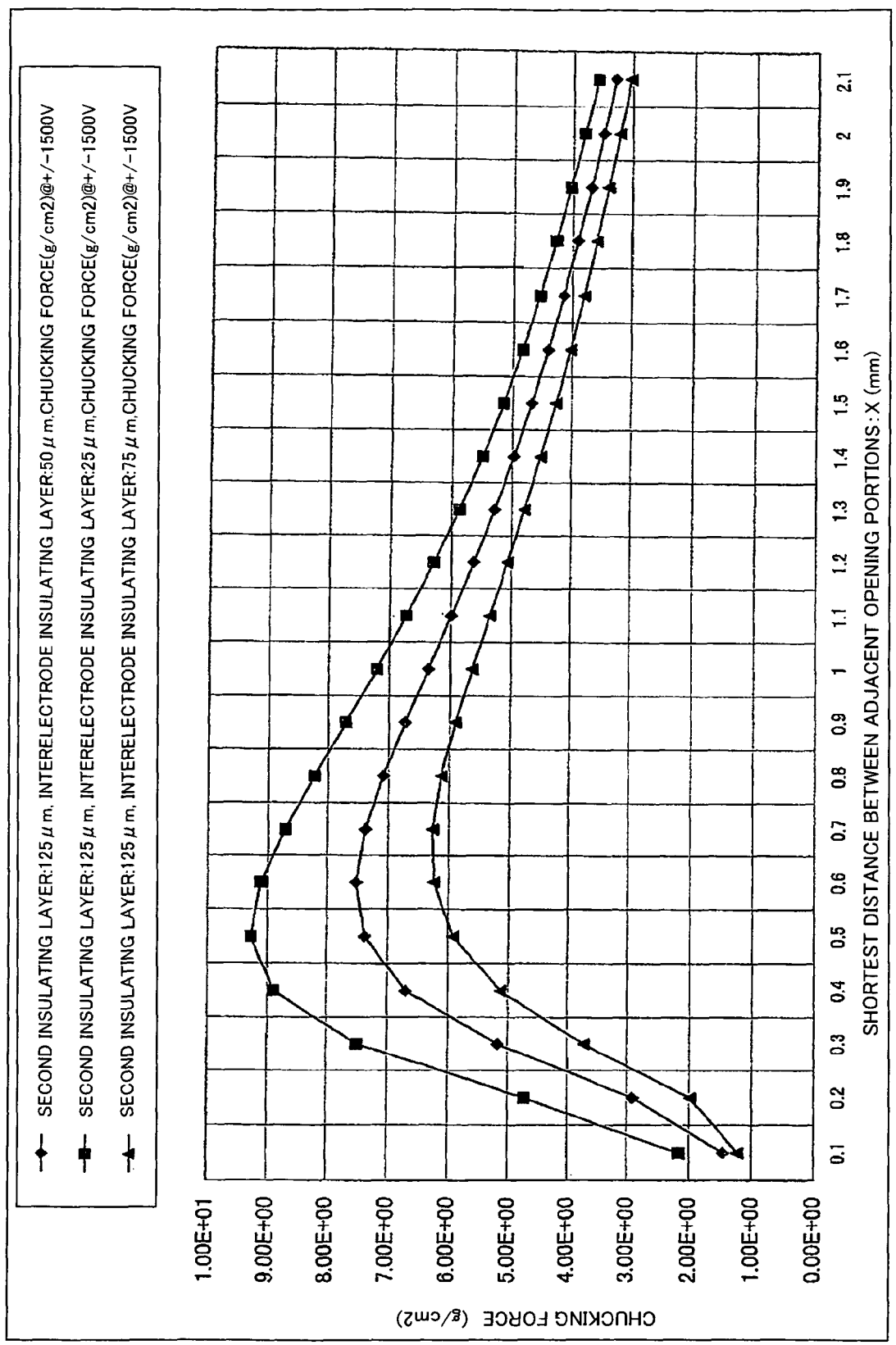
FIG. 6 is a graph showing a relationship between the shortest distance X between the adjacent opening portions in the pattern electrode having the comb-shaped conductive portion and the chucking force in the case where the pattern electrode is used for the electrostatic chuck (film thickness of second insulating layer is fixed).

With respect to conditions for calculation, the entire flat area of the first electrode layer 3 is assumed to be a conductive portion, a thickness of the first electrode layer 3 and the second electrode layer 5 is set to 10 μm, and a potential difference between the electrode layers is set to 3000 V. Each of the interelectrode insulating layer 4 and the second insulating layer 6 is assumed to be made of polyimide. In particular, a dielectric constant of the second insulating layer 6 is set to 3.5 for calculation. An attracted/held substrate 8 is a glass substrate whose thickness is 0.5 mm and dielectric constant is 5.5. Two-dimensional general-purpose electromagnetic field calculation software is used for calculation. FIG. 5 shows a relationship between the shortest distance X and the chucking force in a case where a film thickness of the second insulating layer 6 is changed to 50 μm, 75 μm, 125 μm, 150 μm, 175 μm, and 200 μm while a film thickness of the interelectrode insulating layer 4 is fixed to 50 μm. FIG. 6 shows a relationship between the shortest distance X and the chucking force in a case where the film thickness of the interelectrode insulating layer 4 is changed to 25 μm, 50 μm, and 75 μm while the film thickness of the second insulating layer 6 is fixed to 125 μm. Note that FIG. 5 also shows a part of a result obtained by calculation in a case where a dielectric constant is set to 9 on the assumption that the second insulating layer 6 is made of ceramic.

As is apparent from FIGS. 5 and 6, at any thickness of the second insulating layer 6 and the film thickness of the interelectrode insulating layer 4, a high chucking force is exhibited in a case where the shortest distance X between the adjacent opening portions 5a (=d: the width of each of the opening portions 5a) is substantially equal to or longer than 0.2 mm. In addition, a peak of the chucking force appears in a range of 0.3 mm to 1.0 mm. When the shortest distance X becomes equal to or longer than 1.3 mm, the chucking force exponentially decreases. It can be read that the position of the peak of the chucking force is shifted in a direction in which the shortest distance X becomes shorter as the film thickness of the second insulating layer 6 becomes smaller. When the dielectric constant of the second insulating layer 6 becomes higher, it is difficult that an electric field from the first electrode layer 3 penetrates through the opening portions 5a. Therefore, it is apparent that the peak of the chucking force is shifted in a direction in which the shortest distance X becomes longer.

Second Calculation Example

Figure 7:
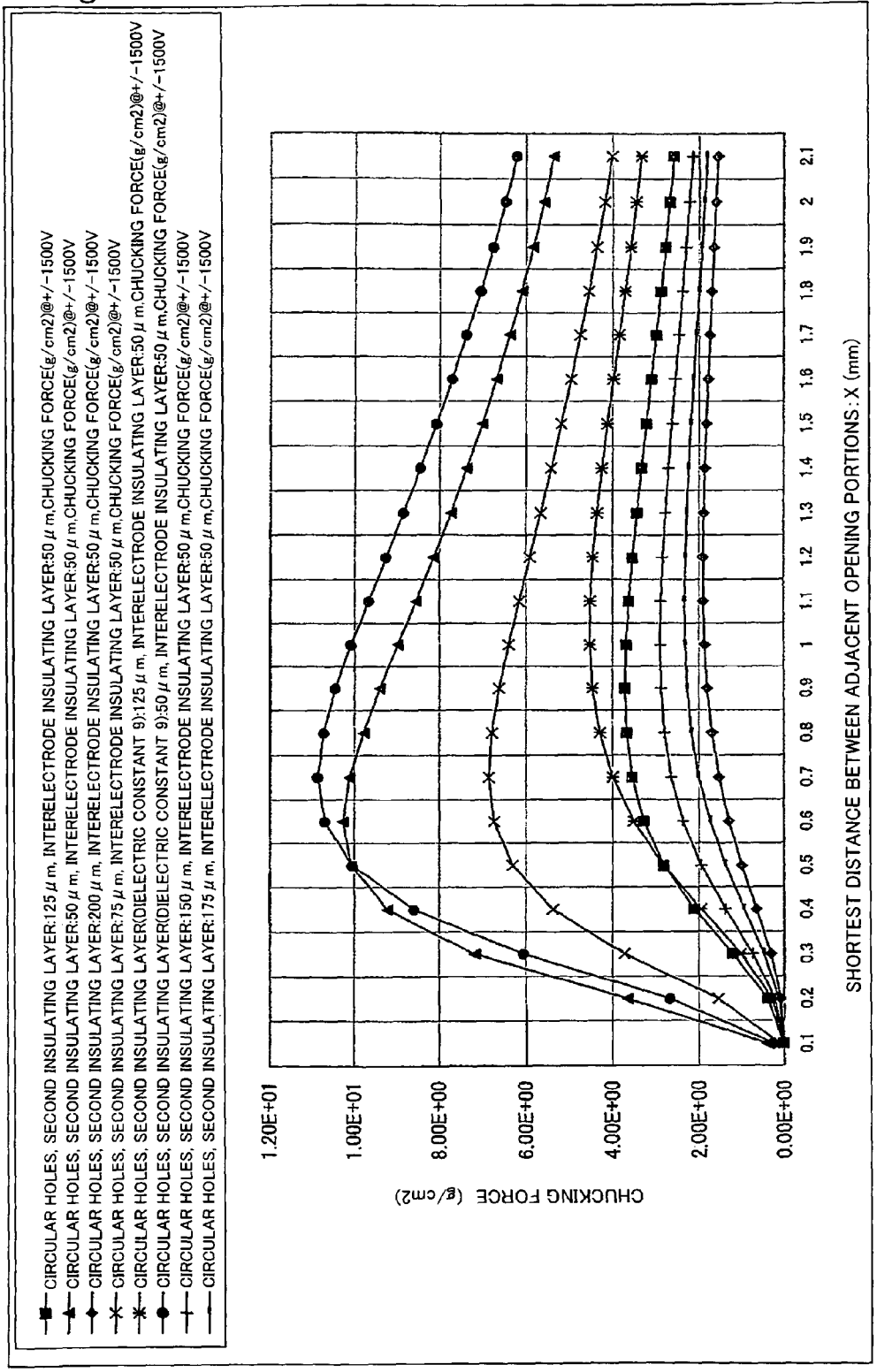
FIG. 7 is a graph showing a relationship between a shortest distance X between adjacent opening portions in the pattern electrode having the mesh-shaped conductive portion and a chucking force in the case where the pattern electrode is used for the electrostatic chuck (film thickness of interelectrode insulating layer is fixed).
Figure 8:
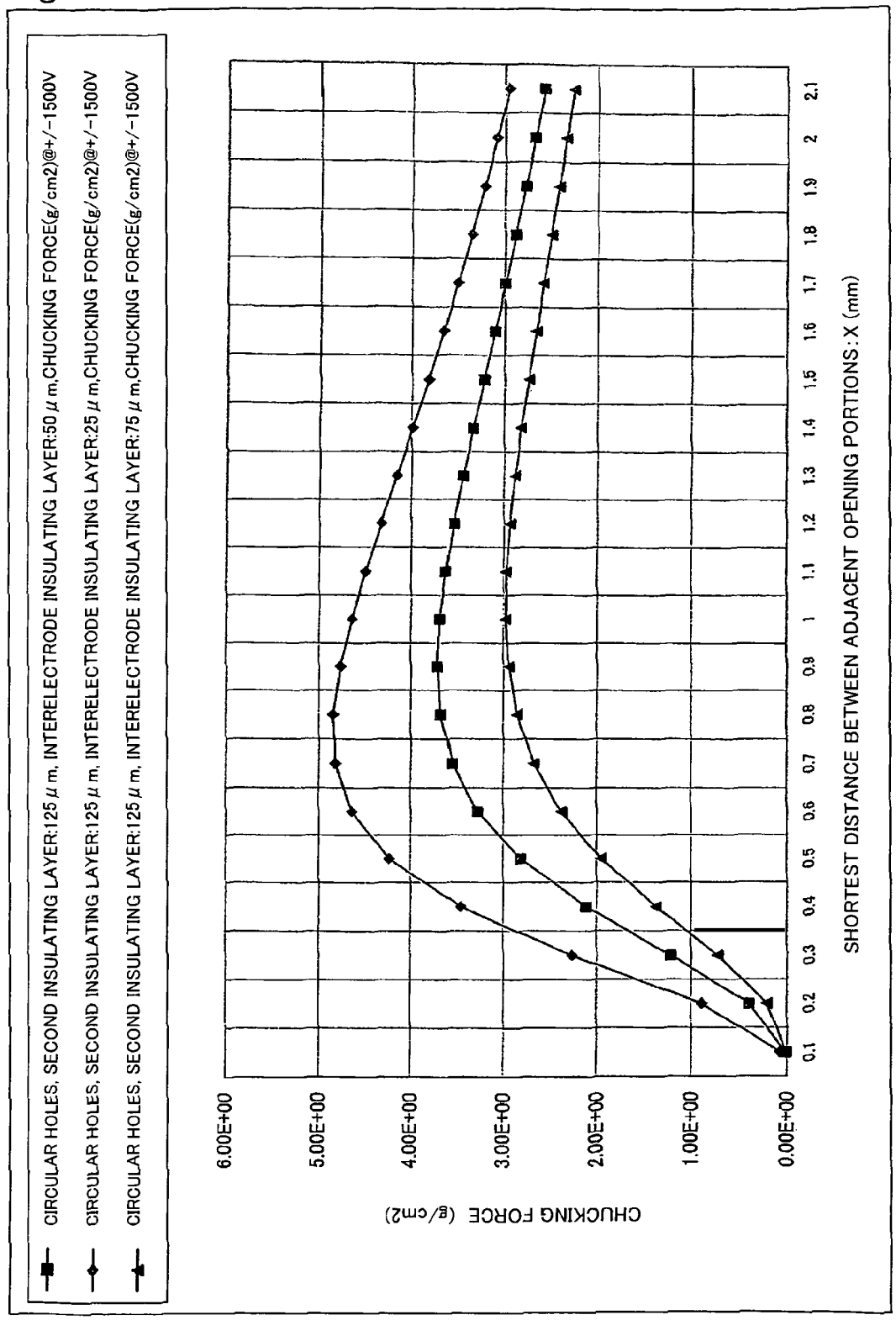
FIG. 8 is a graph showing a relationship between the shortest distance X between the adjacent opening portions in the pattern electrode having the mesh-shaped conductive portion and the chucking force in the case where the pattern electrode is used for the electrostatic chuck (film thickness of second insulating layer is fixed).

As shown in FIG. 1, the second electrode layer 5 is a pattern electrode in which a plurality of circular holes 5c are arranged within a flat area to form a mesh-shaped conductive portion 5b. In this case, a relationship between the shortest distance X between the adjacent circular holes 5c and the chucking force on the sample chucking surface 7 in a case where the pattern electrode is used for the electrostatic chuck is examined. With respect to the circular holes 5c, when attention is focused on a circular hole "A", six circular holes B to G adjacent to the circular hole "A" are arranged such that the centers of the six circular holes are located at the vertices of a regular hexagon. In the case of the pattern electrode, while the shortest distance X between the adjacent circular holes 5c is made equal to a diameter d of each of the circular holes 5c, that is, while X=d is maintained, the values of X and d are adjusted and the chucking force per unit area on the sample chucking surface 7 corresponding to the surface of the second insulating layer 6 is obtained by the same calculation as that in the first calculation example. FIG. 7 shows a relationship between the shortest distance X and the chucking force in the case where a film thickness of the second insulating layer 6 is changed to 50 μm, 75 μm, 125 μm, 150 μm, 175 μm, and 200 μm while a film thickness of the interelectrode insulating layer 4 is fixed to 50 μm. FIG. 8 shows a relationship between the shortest distance X and the chucking force in the case where the film thickness of the interelectrode insulating layer 4 is changed to 25 μm, 50 μm, and 75 μm while the film thickness of the second insulating layer 6 is fixed to 125 μm. Note that FIG. 7 also shows a part of a result obtained by calculation in the case where a dielectric constant is set to 9 on the assumption that the second insulating layer 6 is made of ceramic.

As is apparent from FIGS. 7 and 8, at any thickness of the second insulating layer 6 and the film thickness of the interelectrode insulating layer 4, a high chucking force is exhibited in the case where the shortest distance X between the adjacent circular holes 5c (=d: the diameter of each of the circular holes) is substantially equal to or longer than 0.2 mm. In addition, a peak of the chucking force appears in a range of 0.3 mm to 1.2 mm. When the shortest distance X becomes equal to or longer than 1.6 mm, the chucking force exponentially decreases. It can be read that the position of the peak of the chucking force is shifted in a direction in which the shortest distance X becomes shorter as the film thickness of the second insulating layer 6 becomes smaller. When the dielectric constant of the second insulating layer 6 becomes higher, it is difficult that an electric field from the first electrode layer 3 penetrates through the circular holes 5c. Therefore, it is apparent that the peak of the chucking force is shifted in a direction in which the shortest distance X becomes longer.

Third Calculation Example

Figure 9:
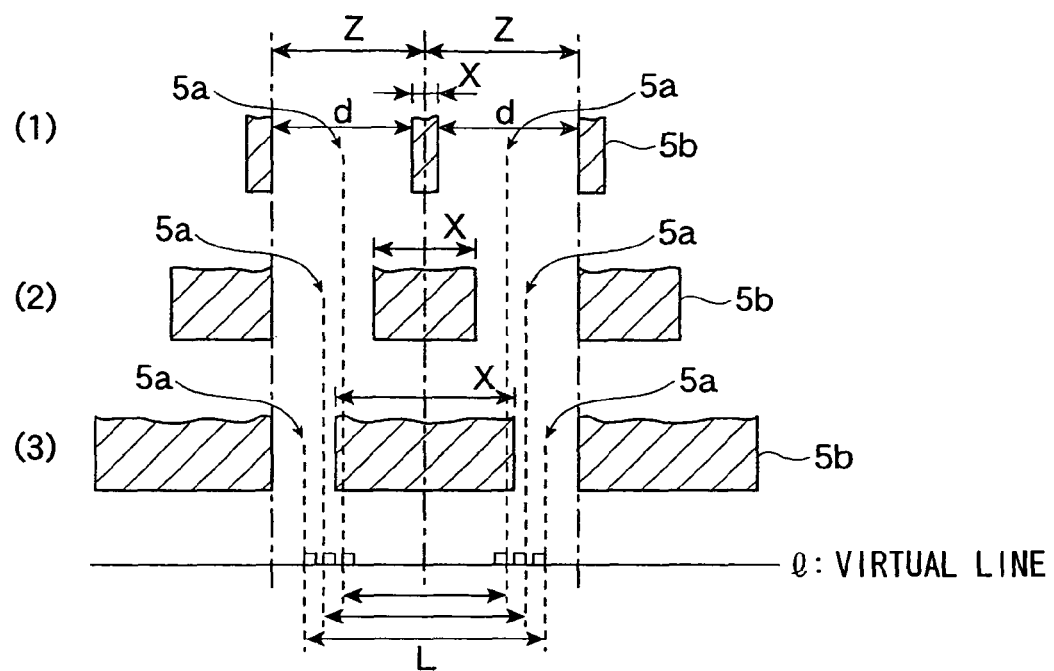
FIGS. 9 (1) to (3) shows a state in which the shortest distance X between opening portions 5a of the pattern electrode having the comb-shaped conductive portion and a width d of each of the opening portions 5a are adjusted in a third calculation example of the present invention.

In a case of the pattern electrode having the comb-shaped conductive portion 5b which is used to from the second electrode layer 5 of the electrostatic chuck X in the first calculation example, a relationship between a value L/X and the chucking force is calculated. The value L/X is obtained based on the shortest distance X between the adjacent opening portions 5a and a length L of a line segment. When a straight line parallel to the shortest distance X is assumed to be a virtual line 1, the line segment is formed by the feet of perpendiculars in a case where the barycenters of the adjacent opening portions 5a are projected to the vertical line. FIG. 9 is a partially enlarged view showing the pattern electrode having the comb-shaped conductive portion 5b. In the calculation, the shortest distance X between the adjacent opening portions 5a (which corresponds to a width of one of band-like electrode portions of the comb-shaped conductive portion) and the width d of the each of the opening portions 5a are adjusted. For example, FIGS. 9 ((1) to (3)) shows a condition in which the width d of each of the opening portions 5a slightly changes as the shortest distance X between the adjacent opening portions 5a significantly changes in the order of (1), (2), and (3). In this case, while a distance Z (including the width d of each of the opening portion 5a) between the center of a conductive portion (one of band-like electrode portions of the comb-shaped conductive portion) in an area sandwiched by the two adjacent opening portions 5a and an end of each of the opening portions 5a is fixed, the values of X and d are adjusted. A relationship between the value of L/X in a case where X and L are adjusted (L=X+D) in the pattern electrode having the comb-shaped conductive portion and the chucking force per unit area on the sample chucking surface 7 in the case where the pattern electrode is used as the second electrode layer 6 is calculated using two-dimensional general-purpose electromagnetic field calculation software. With respect to conditions for this calculation, a thickness of the interelectrode insulating layer 4 is set to 50 μm and a dielectric constant thereof is set to 3.5. The dielectric constant of the second insulating layer 6 is set to 3.5. The calculation is performed in the case where the thickness of the second insulating layer 6 is set to 50 μm, 125 μm, and 200 μm. Other conditions for the first insulating layer, the first electrode layer, the second electrode layer, and the glass substrate (object to be attracted) are equal to those in a first test example.

Figure 10:
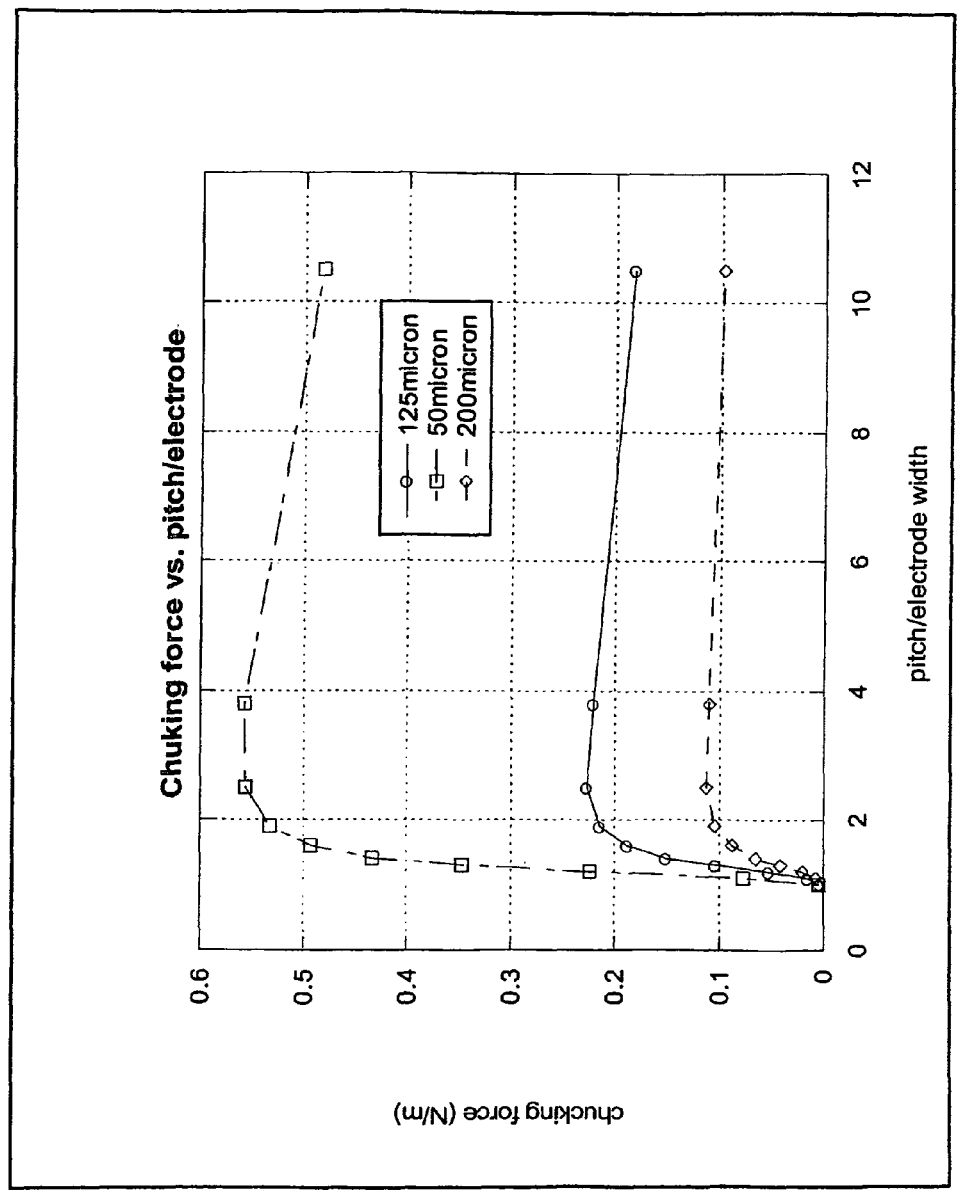
FIG. 10 shows a result obtained by calculation for a relationship between L/X in the pattern electrode having the comb-shaped conductive portion and the chucking force in the third calculation example (in the case of Z=1 mm).
Figure 11:
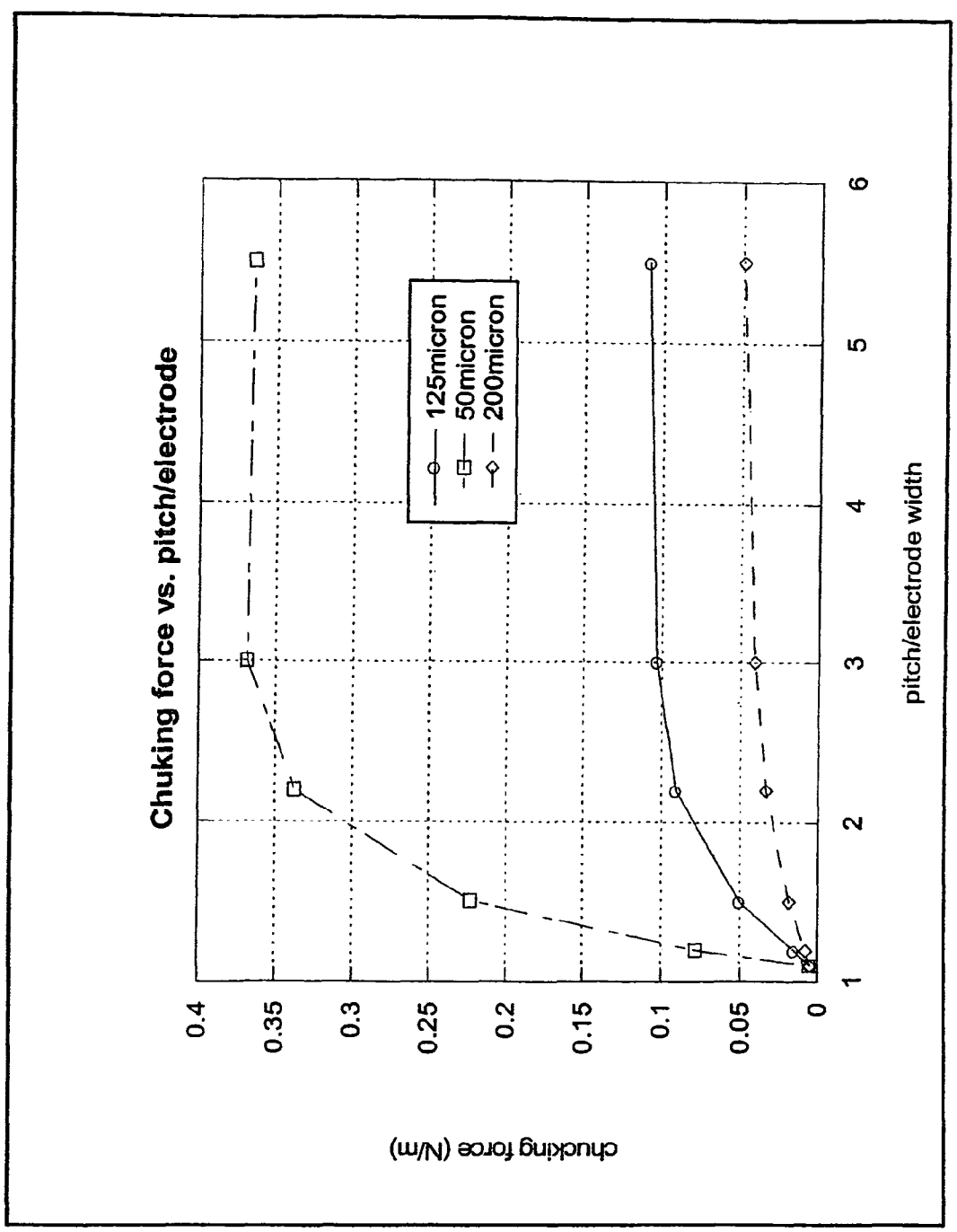
FIG. 11 shows a result obtained by calculation for a relationship between L/X in the pattern electrode having the comb-shaped conductive portion and the chucking force in the third calculation example (in the case of Z=0.5 mm).
Figure 12:
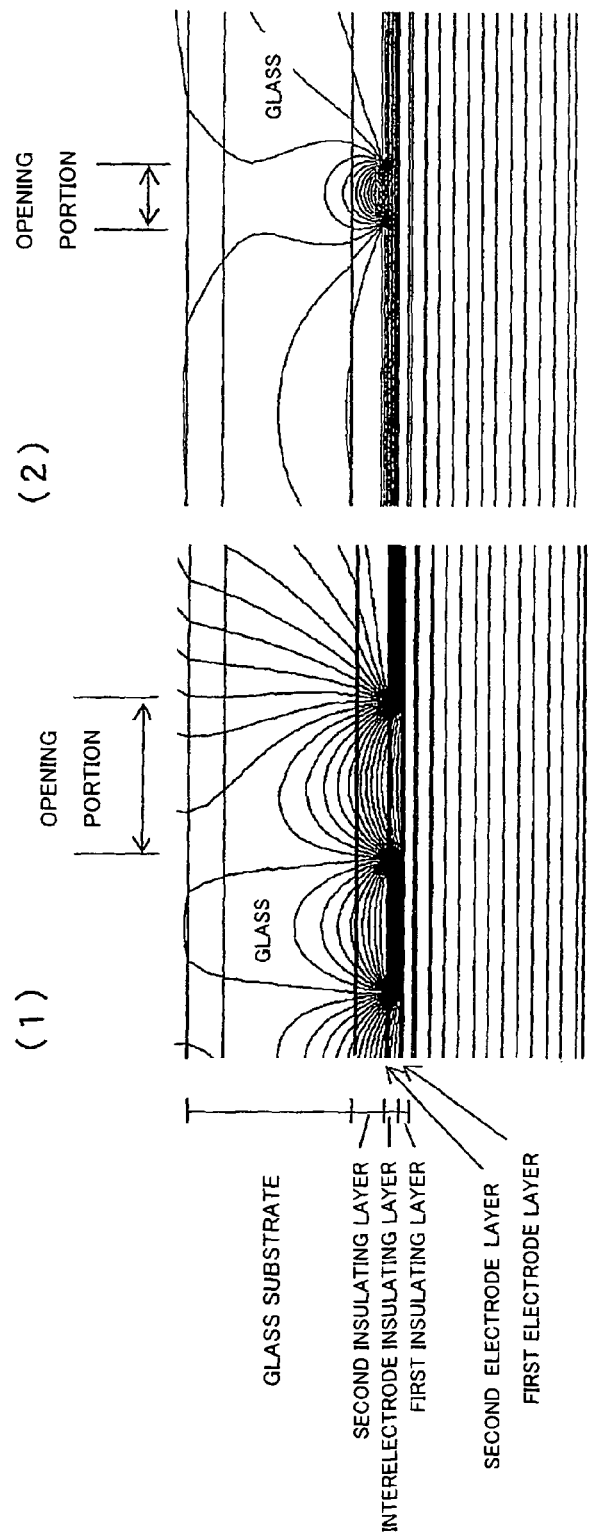
FIG. 12 shows a distribution of a potential contour (40 V) acting a glass substrate in the third calculation example (corresponding to the explanatory view showing the cross-section A-A' of the electrostatic chuck shown in FIG. 3).

FIG. 10 shows a result obtained by calculation in a case of Z=1 mm. FIG. 11 shows a result obtained by calculation in a case of Z=0.5 mm. As is apparent from any of the cases, the chucking force begins to increase at L/X equal to or larger than 1.5 and a high chucking force can be exercised in a range of L/X of 2 to 4. When L/X becomes larger than 5, an increase in chucking force saturates. In some cases, a slight reduction trend occurs. It can be observed that the trend is not almost affected by the thickness of the second insulating layer 6. FIG. 12(1) shows a distribution of a potential contour (40 V) acting the glass substrate under a condition in which the width d of each of the opening portions 5a is 0.75 and L/X is 2.5 in the case of Z=1 mm. FIG. 12(2) shows a distribution of the potential contour (40 V) acting the glass substrate under a condition in which the width d of each of the opening portions 5a is 0.25 and L/X is 1.2 in the case of Z=1 mm. It is apparent that, while the potential contour is densely distributed in the glass substrate in the case of FIG. 12(1), the potential contour is roughly distributed in the case of FIG. 12(2).

Fourth Calculation Example

Figure 13:
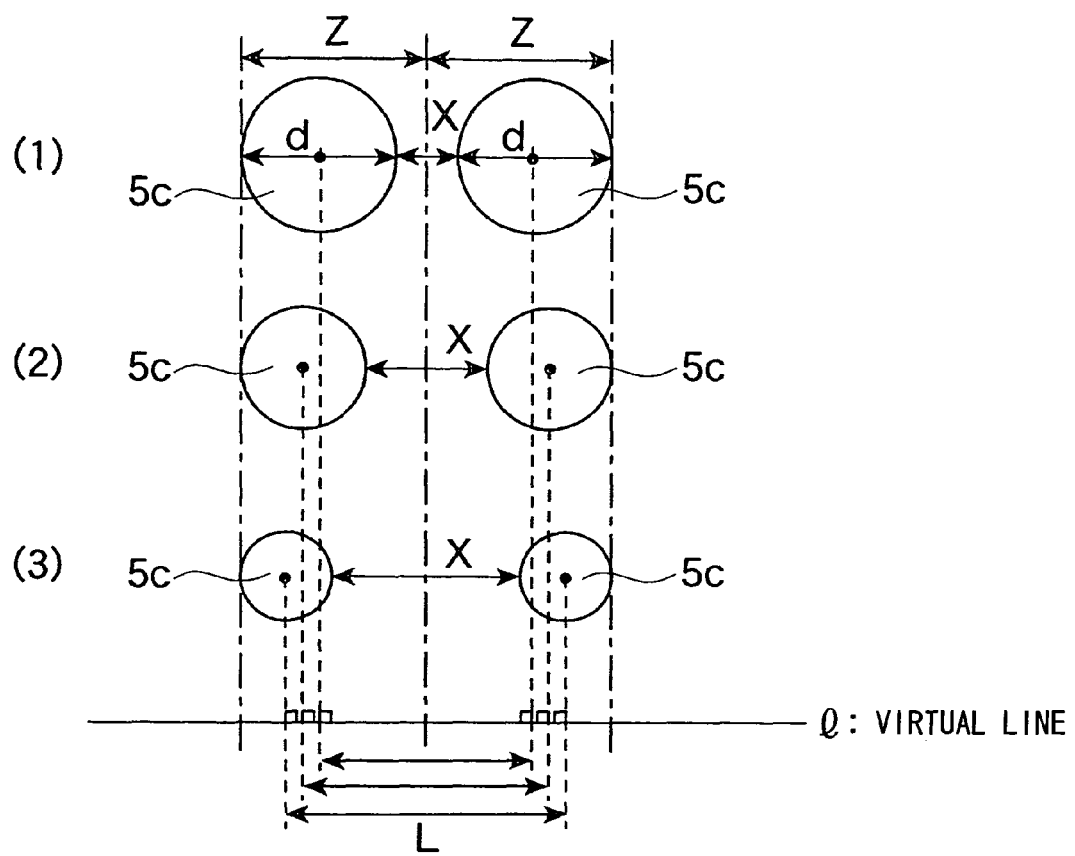
FIGS. 13 (1) to (3) shows a state in which the shortest distance X between the opening portions 5a of the pattern electrode having the mesh-shaped conductive portion and the width d of each of the opening portions 5a are adjusted in a fourth calculation example of the present invention.
Figure 14:
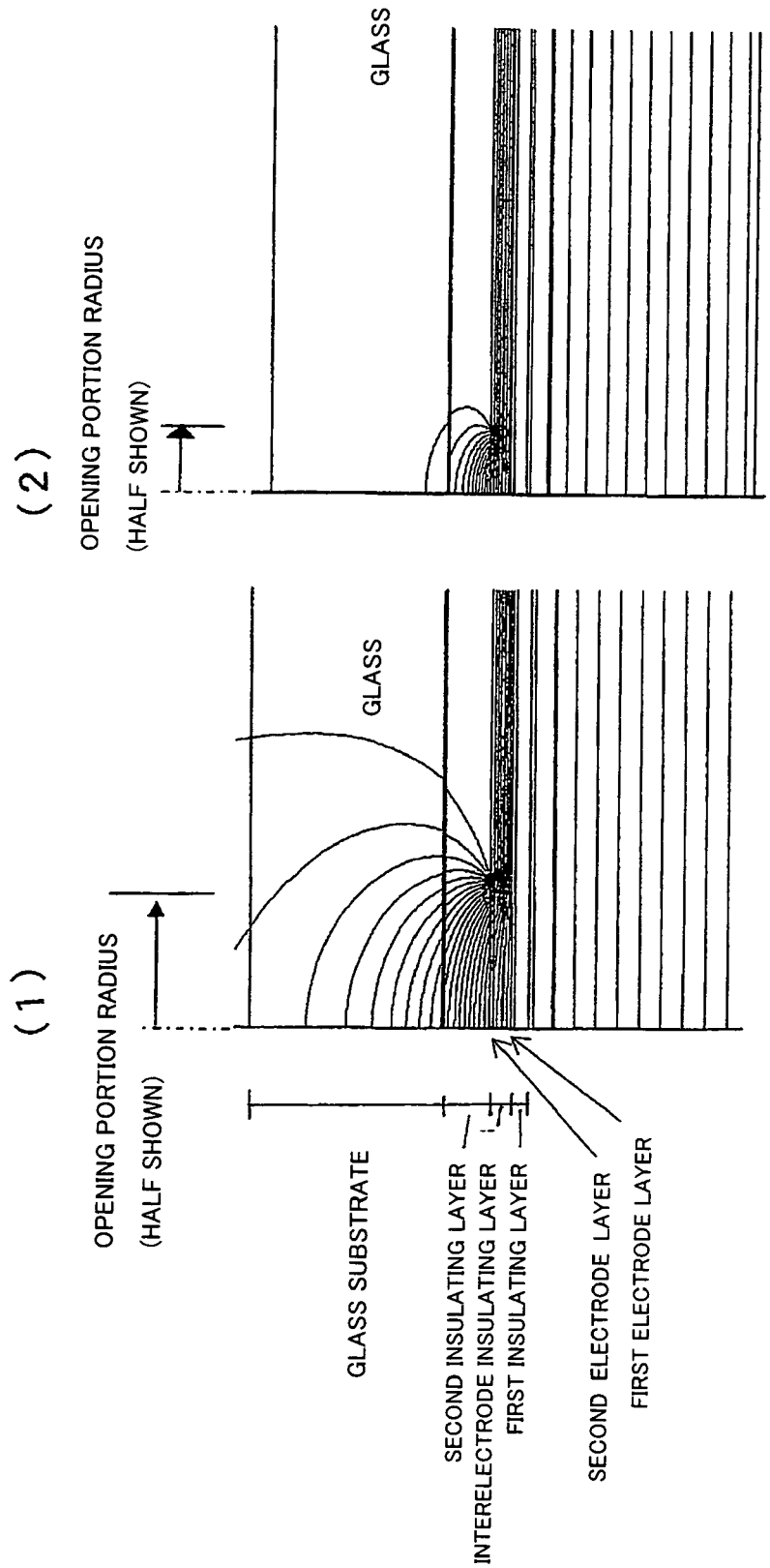
FIG. 14 shows a distribution of a potential contour (40 V) acting a glass substrate in the fourth calculation example (corresponding to the explanatory view showing the cross-section A-A' of the electrostatic chuck shown in FIG. 3).

As shown in FIG. 1, the pattern electrode having the mesh-shaped conductive portion 5b in which the plurality of circular holes 5c are arranged within the flat area is used as the second electrode layer 5. In this case, the same calculation as that in the third calculation example is performed. As partially shown in FIG. 13, while the shortest distance X between the adjacent circular holes 5c and the diameter d of each of the circular holes 5c are adjusted, a relationship between the value of L/X and the chucking force per unit area on the sample chucking surface 7 in the case where the pattern electrode is used as the second electrode layer 6 is obtained by calculation. Then, substantially the same result as that in the case of the third calculation example is obtained. FIG. 14(1) shows a distribution of the potential contour (40 V) acting the glass substrate under a condition in which the diameter d of each of the circular holes 5c is 0.75 and L/X is 1.5 in the case of Z=1.5 mm. FIG. 14(2) shows a distribution of the potential contour (40 V) acting the glass substrate under a condition in which the diameter d of each of the circular holes 5c is 0.25 and L/X is 1.1 in the case of Z=1.5 mm. It is apparent that, while the potential contour is densely distributed in the glass substrate in the case of FIG. 14(1), the potential contour is roughly distributed in the case of FIG. 14(2). Therefore, in the case of the mesh-shaped pattern electrode using the circular holes as the opening portions, a trend can be read in which the gradient force is concentrated particularly above the circular hole. In the case of the circular hole, when the diameter d thereof is set to a value larger than the width d of the opening portion in the comb-shaped pattern electrode, there may be an advantage.

First Embodiment

FIG. 3 is an explanatory exploded perspective view showing a bipolar electrostatic chuck X according to a first embodiment. FIG. 4 is an explanatory view showing a part of a cross-section A-A' of the bipolar electrostatic chuck X shown in FIG. 3. A polyimide sheet which is 206 mm long and 206 mm wide is employed in which a copper surface layer having a film thickness of 12 μm is provided on a surface of a polyimide layer (name of product manufactured by Mitsui Chemicals, Inc.: NEOFLEX). The polyimide layer (50 μm in film thickness and 3.5 in dielectric constant) is provided as the interelectrode insulating layer 4. An outer edge of the copper surface layer is removed by etching to form the first electrode layer 3 (200 mm long and 200 mm wide) in which the entire flat area corresponds to the conductive portion. A chromium film is deposited at 0.1 μm on the surface of the polyimide layer (interelectrode insulating layer 4) of the polyimide sheet and a copper film whose film thickness is 0.4 μm is formed on the chromium film by an ion plating method. A surface of the formed copper film is subjected to predetermined mask processing and then etching processing is performed. As a result, as shown in FIG. 2, the pattern electrode having the comb-shaped conductive portion 5b in which the plurality of rectangular opening portions 5a, which are opened at one end, are arranged is formed. The pattern electrode is used as the second electrode layer 5. In the formed pattern electrode, the opening portions 5a are regularly arranged within the flat area of 200 mm long and 200 mm wide such that the opening width d of each of the opening portions 5a is 1 mm, and the shortest distance X between the adjacent opening portions 5a is 1 mm, and the barycenters of opening portions 5a other than adjacent opening portions are located on a straight line including a line corresponding to the shortest distance X between the adjacent opening portions 5a. In other words, in the case of the pattern electrode, L=2 mm and L/X=2.

The second insulating layer 6 which is a polyimide film whose length is 206 mm, width is 206 mm, film thickness is 125 µm, and dielectric constant is 3.5 (name of product manufactured by Du Pont-Toray Co., Ltd.: Kapton) is laminated on the surface of the pattern electrode forming the second electrode layer 5 through a thermoplastic polyamide adhesive sheet whose film thickness is 20 µm (not shown). The first insulating layer 2 which is a polyimide film whose length is 206 mm, width is 206 mm, film thickness is 40 µm, and dielectric constant is 3.5 (name of product manufactured by Du Pont-Toray Co., Ltd.: Kapton) is laminated on the surface of the first electrode layer 3 through the adhesive sheet (not shown). A cushion material (not shown) is laminated on each of an upper surface side of the second insulating layer 6 and a lower surface side of the first insulating layer 2. Then, the resultant laminate is set in a hot press and heated and pressurized under a condition in which a thickness direction pressure is 2 MPa, a heat temperature is 150° C., and a holding time is 5 minutes. After that, the cushion materials are removed to produce an electrode sheet 9 having the laminate structure in which the first insulating layer 2, the first electrode layer 3, the interelectrode insulating layer 4, the second electrode layer 5, and the second insulating layer 6 are successively laminated.

The obtained electrode sheet 9 is bonded to the aluminum base 1 which is made of an aluminum alloy (A5056) and includes a water-cooled tube which is not shown. In order to maintain the flatness of the electrode sheet 9 to be finished, the electrode sheet 9 is laminated on a surface of a porous ceramic (not shown) whose flatness is maintained with a state in which the second insulating layer 6 of the electrode sheet 9 is opposed to the porous ceramic. After that, the aluminum base is provided on the first insulating layer 2 of the electrode sheet 9 through spacers (not shown), each of which is 0.7 in height and 5 mm in diameter and made of a flexible material. A self-adhesive liquid silicone rubber (name of product manufactured by GE Toshiba Silicones Co., Ltd: TSE3663) (not shown) is injected to a gap between the aluminum base 1 and the electrode sheet 9 which is formed by the spacers and degassing is performed under a vacuum. Then, vacuuming is performed through the porous ceramic to bring the electrode sheet 9 into sufficient contact with the surface of the porous ceramic. It takes approximately twenty-four hours to cure the silicone rubber. Therefore, the bipolar electrostatic chuck X is completed in which the electrode sheet 9 is laminated on the aluminum base through a flexible layer (not shown) which is made of a silicone rubber and has a thickness of 0.7 mm. The surface (sample chucking surface 7) of the second insulating layer 6 in the completed electrostatic chuck X is surface unevenness of up to approximately ±1 µm, so lapping is not particularly required.

Second Embodiment

The polyimide sheet (name of product manufactured by Mitsui Chemicals, Inc.: NEOFLEX) is used as in the case of the first embodiment and cut off at a diameter of 184 mm. The polyimide layer is provided as the interelectrode insulating layer 4. The outer edge of the copper surface layer is removed by etching to form the first electrode layer 3 having a diameter of 182 mm in which the entire flat area corresponds to the conductive portion. A chromium film is deposited at 0.1 µm on the surface of the polyimide layer (interelectrode insulating layer 4) of the polyimide sheet and a copper film whose film thickness is 0.4 µm is formed on the chromium film by an ion plating method. Then, predetermined mask processing and etching processing are performed. As a result, as shown in FIG. 1, the pattern electrode having the mesh-shaped conductive portion 5b in which the plurality of circular holes 5c each having a diameter d of 1.2 mm are provided is formed. The pattern electrode is used as the second electrode layer 5. In the pattern electrode, the plurality of circular holes 5c are regularly arranged within the flat area whose diameter is 182 mm. When attention is focused on one of the circular holes 5c, six of the circular holes 5c which are adjacent to the one of the circular holes 5c are arranged such that the centers of the six circular holes 5c correspond to the vertices of the regular hexagon. The shortest distance X between the adjacent circular holes 5c is 1.0 mm. In the case of the pattern electrode, L=2.2 and L/X=2.2. The electrode sheet 9 is produced as in the first embodiment and then the bipolar electrostatic chuck X is completed as in the first embodiment.

First Test Example

The chucking force of the bipolar electrostatic chuck X obtained in each of the first embodiment and the second embodiment is evaluated. First, a test silicon wafer whose size is 20 mm×20 mm is prepared from a silicon wafer whose thickness is 0.75 mm and placed in the center of the sample chucking surface 7 of the electrostatic chuck X which is obtained in each of the first embodiment and the second embodiment and provided under a vacuum of 800 mTorr. Then, a voltage difference of 3000 V is applied between the first electrode layer 3 and the second electrode layer 5 to attract the test silicon wafer. A chucking strength in the case where the test silicon wafer is pulled at a speed of 0.5 mm/minute in a perpendicular direction to the chucking surface under room temperature is measured by a load cell. A time for attracting the test silicon wafer is set to one minute. The same measurement is performed on a test glass substrate (5.5 in dielectric constant) whose length is 20 mm, width is 20 mm, and film thickness is 0.7 µm. Table 1 shows respective results.

TABLE 1

| | Silicon wafer for test [gf/cm$^2$] | Glass substrate for test [gf/cm$^2$] |
|---|---|---|
| First embodiment | 60 | 6 |
| Second embodiment | 112 | 2.5 |

Second Test Example

A substrate temperature in the case where the electrostatic chuck X obtained in the second embodiment is actually used for an ion implanting device is evaluated. The electrostatic chuck X obtained in the second embodiment is set in a hybrid scan type ion implanting device. A voltage difference of 3000V is applied between the first electrode layer 3 and the second electrode layer 5 to attract a silicon wafer 8 having a diameter of 200 mm to the sample chucking surface 7 of the electrostatic chuck X. Then, while cooling water is supplied to the water-cooled tube of the aluminum base 1 at a rate of 2 liters/minute, ion implantation is performed on the silicon wafer 8 at an ion beam power of 450 W and an ion implantation dose of 1E15 ions/cm. At this time, thermo-labels are attached to the center of the silicon wafer 8 and four points on the circumference of a circle whose diameter is 110 mm, that is, five locations in total and then temperatures are measured at the respective locations. As a result, an average temperature of the five locations is 90° C. For reference, the silicon wafer is attracted to the electrostatic chuck produced in the same way as in the second embodiment except for the fact that the flexible layer made of silicone rubber is not provided. Then, the temperature of the silicon wafer in the case where the ion implantation is performed under the same condition as above is measured. As a result, it is found that the average temperature of the five locations is equal to or larger than 120° C.

Figure 15:
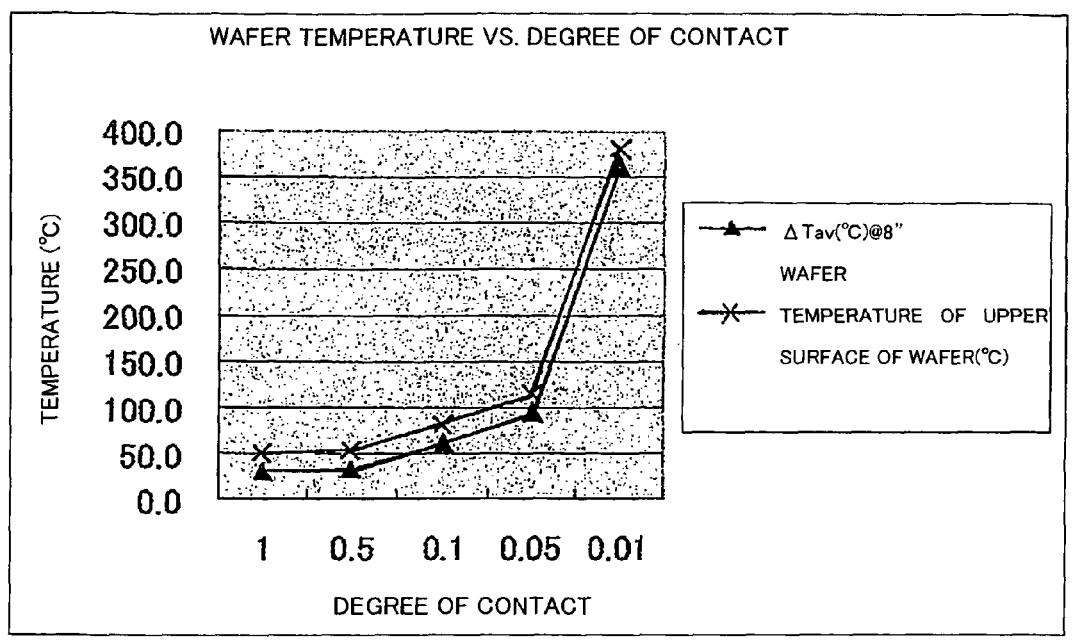
FIG. 15 shows a relationship between a degree of contact between a sample chucking surface of an electrostatic chuck according to a second embodiment and a substrate (wafer) and a substrate temperature.

The flexible layer provided in the electrostatic chuck X in each of the first embodiment and the second embodiment premises that a virtual press contactor having a width of 10 mm sinks by 0.1 µm or more (0.3 µm in maximum) in the case where the silicone rubber (hardness is 0.01 GPa in Young's modulus) is used and the chucking force is set to 50 gf/cm². FIG. 15 shows a result obtained by calculating a relationship between the degree of contact between the wafer and the sample chucking surface 7 and the temperature of the wafer in the case where the electrostatic chuck X obtained in the second embodiment is set in the ion implanting device to attract an eighth-inch silicon wafer and ion implantation is performed under the same condition as that of the second test example. In the abscissa, the numerical value 1 indicates a state in which the entire surface of the wafer is completely in contact with the sample chucking surface 7, and the numerical value 0.01 indicates a state in which an area with 10% of a flat area of the wafer is in contact with the sample chucking surface 7. Therefore, from the result obtained in the second test example, the degree of contact between the sample chucking surface 7 of the electrostatic chuck X obtained in the second embodiment and the wafer may be approximately 10%.

The invention claimed is:

1. An electrostatic chuck comprising a laminate structure in which a first insulating layer, a first electrode layer, an interelectrode insulating layer, a second electrode layer, and a second insulating layer are successively laminated on a metal base in an order of increasing distance from the metal base, wherein:
    the second electrode layer comprises a pattern electrode having a plurality of opening portions with circular holes within a flat area; and
    a shortest distance X between mutually adjacent opening portions and a length L of a line segment formed by feet of perpendiculars when centers of the adjacent opening portions are projected to a virtual line which is a straight line parallel to the shortest distance X satisfy L/X≧1.5 and L<2.6 mm.

2. An electrostatic chuck according to claim 1, wherein the shortest distance X between the adjacent opening portions is equal to or larger than 0.2 mm and smaller than 1.6 mm.

3. An electrostatic chuck according to claim 1 or 2, wherein at least the centers of the adjacent opening portions are located on a straight line including the shortest distance X between the adjacent opening portions.

4. An electrostatic chuck according to claim 1, wherein:
    the second electrode layer comprises a pattern electrode formed to have a mesh-shaped conductive portion in which a plurality of opening portions with circular holes are arranged; and
    centers of six circular holes adjacent to one of the circular holes are located at vertices of a regular hexagon.

5. An electrostatic chuck according to claim 1, wherein the second electrode layer comprises a pattern electrode formed with a film thickness of 0.1 µm to 5 µm by an ion plating method.

6. An electrostatic chuck according to claim 1, further comprising a flexible layer which is located between the metal base and the first insulating layer; has a film thickness of 500 µm to 1000 µm, and is made of silicone rubber.

7. An electrode sheet for an electrostatic chuck comprising a laminate structure in which a first insulating layer, a first electrode layer, an interelectrode insulating layer, a second electrode layer, and a second insulating layer are successively laminated, wherein:
    the second electrode layer comprises a pattern electrode having a plurality of opening portions with circular holes within a flat area; and
    a shortest distance X between mutually adjacent opening portions and a length L of a line segment formed by feet of perpendiculars when centers of the adjacent opening portions are projected to a virtual line which is a straight line parallel to the shortest distance X satisfy L/X≧1.5 and L<2.6 mm.

8. An electrode sheet for an electrostatic chuck according to claim 7, wherein the shortest distance X between the adjacent opening portions is equal to or larger than 0.2 mm and smaller than 1.6 mm.

9. An electrode sheet for an electrostatic chuck according to claim 7 or 8, wherein at least the centers of the adjacent opening portions are located on a straight line including the shortest distance X between the adjacent opening portions.

10. An electrode sheet for an electrostatic chuck according to claim 7, wherein:
    the second electrode layer comprises a pattern electrode formed to have a mesh-shaped conductive portion in which a plurality of opening portions with circular holes are arranged; and
    centers of opening portions adjacent to one of the opening portions are located at vertices of a regular hexagon.

11. An electrode sheet for an electrostatic chuck according to claim 7, wherein the second electrode layer comprises a pattern electrode formed with a film thickness of 0.1 µm to 5 µm by an ion plating method.

* * * * *